(12) United States Patent
Encarnacion et al.

(10) Patent No.: US 12,355,171 B2
(45) Date of Patent: Jul. 8, 2025

(54) FRAMEWORK INCLUDING AN INTERPOSER HAVING AN ATYPICAL SHAPE

(71) Applicant: Intel Corporation, Santa Clara, CA (US)

(72) Inventors: Ulises Encarnacion, Jalisco (MX); Luis Ricardo Perez Corona, Jalisco (MX); Ricardo Astro Bohorquez, Jalisco (MX); Antonio Zenteno Ramirez, Jalisco (MX); Maria J. Garcia Garcia De Leon, Jalisco (MX)

(73) Assignee: Intel Corporation, Santa Clara, CA (US)

( * ) Notice: Subject to any disclaimer, the term of this patent is extended or adjusted under 35 U.S.C. 154(b) by 863 days.

(21) Appl. No.: 17/303,991

(22) Filed: Jun. 11, 2021

(65) Prior Publication Data
US 2022/0094094 A1   Mar. 24, 2022

(51) Int. Cl.
*H01R 12/82*   (2011.01)

(52) U.S. Cl.
CPC ......... *H01R 12/82* (2013.01); *H01R 2201/20* (2013.01)

(58) Field of Classification Search
CPC .. H01R 12/82; H01R 2201/20; H05K 7/1061; G01R 31/2851; G01R 1/0408; G01R 31/2886; G01R 31/2896
See application file for complete search history.

(56) References Cited

U.S. PATENT DOCUMENTS

| | | | | |
|---|---|---|---|---|
| 2007/0224845 | A1* | 9/2007 | Becker | H01L 23/3675 257/E23.087 |
| 2007/0232090 | A1* | 10/2007 | Colgan | H01L 23/49838 257/E23.068 |
| 2019/0306985 | A1* | 10/2019 | Ferguson | H01R 12/88 |
| 2020/0303291 | A1 | 9/2020 | Perez-Corona et al. | |

* cited by examiner

*Primary Examiner* — Jean F Duverne
(74) *Attorney, Agent, or Firm* — Schwabe, Williamson & Wyatt, P.C.

(57) ABSTRACT

In one embodiment, an apparatus includes an integrated circuit (IC) socket and an interposer. The IC socket includes a cavity to receive an IC package including first and second sets of IC contacts, the cavity defined by a base including a set of IC socket interconnects and a frame extending from the base with at least one opening through the frame. The interposer includes a cavity portion disposed adjacent the base of the IC socket, an external portion extending from the cavity portion through one of the at least one opening, at least one connector disposed on the external portion, a first set of interposer interconnects to electrically couple each of the first set of IC contacts with a corresponding one of the set of IC socket interconnects, and a second set of interposer interconnects to electrically couple each of the second set of IC contacts with one of the at least one connector. Other embodiments are described and claimed.

20 Claims, 11 Drawing Sheets

FRAMEWORK INCLUDING AN INTERPOSER HAVING AN ATYPICAL SHAPE

TECHNICAL FIELD

Embodiments relate to frameworks including interposers.

BACKGROUND

Manufacturers often use validation frameworks to perform validation of IC packages. A validation framework typically includes a reference platform that is comparable to a customer platform, a riser, an interposer including validation connectors, and an interface socket. The IC socket is disposed on the reference platform. The riser is disposed within the IC socket and elevates the interposer so that it sits across the top of the IC socket and avoids any mechanical obstacles that may be present on the reference platform. The interface socket is typically a flexible elastomer based socket that is disposed on top of the interposer to removeably couple a package substrate of an IC package to the validation framework.

In many cases, the riser may be three times thicker than the package substrate of the IC package. The thickness of the riser may negatively impact signal integrity, power delivery, and high speed interface performance during the validation of the IC package. Furthermore, a riser may represent as much as 45% of the cost of the validation framework. In many cases, the riser may consist of around 70% of the electrical path between the IC socket and the package substrate of the IC package.

DETAILED DESCRIPTION

Integrated circuit (IC) packages that are configured for the performance of validation typically include a set of IC functional contacts and a set of IC validation contacts disposed on a package substrate of the IC package. The IC functional contacts are designed to interface with a customer platform to enable the IC package to perform its intended function and the IC validation contacts are dedicated for the performance of validation of the IC package. Manufacturers typically use a validation framework to perform validation of IC packages. The validation framework includes a reference platform that is comparable to the customer platform, an IC socket, an interposer including validation connectors, and an interface socket.

The reference platform is similar to the customer platform and includes a set of platform pads. The IC socket includes a cavity to receive an IC package for validation. The cavity is defined by a base and a frame that extends from the base. The base includes a set of IC socket interconnects. Each of the IC socket interconnects is electrically coupled to one of the platform pads on the reference platform. The frame includes one or more openings that extend through the frame.

The interposer includes a cavity portion and an external portion. The cavity portion includes a set of interposer functional interconnects and a set of interposer validation interconnects. The cavity portion is disposed adjacent the base of the IC socket. Each of the interposer functional interconnects are directly coupled to one of the set of IC socket interconnects. The external portion of the interposer extends through one of the openings in the frame. One or more validation connectors are disposed on the external portion of the interposer. Each of the interposer validation interconnects is electrically coupled to one of the validation connectors.

An elastomer interface socket is disposed on top of the cavity portion of the interposer. The interface socket includes a set of interface interconnects. Each of the interface interconnects is electrically coupled on one of the interposer functional interconnects or to one of the interposer validation interconnects. The elastomer interface socket enables the IC package to be removeably coupled to the validation framework.

When an IC package is coupled to the validation framework to implement validation, each of the IC functional contacts are electrically coupled to one of the platform pads on the reference platform via the an interface interconnect, an interposer functional interconnect, and an IC socket interconnect and each the IC validation contacts are electrically coupled to one of the validation connectors via an interface interconnect and an interposer validation interconnect.

Figure 1:
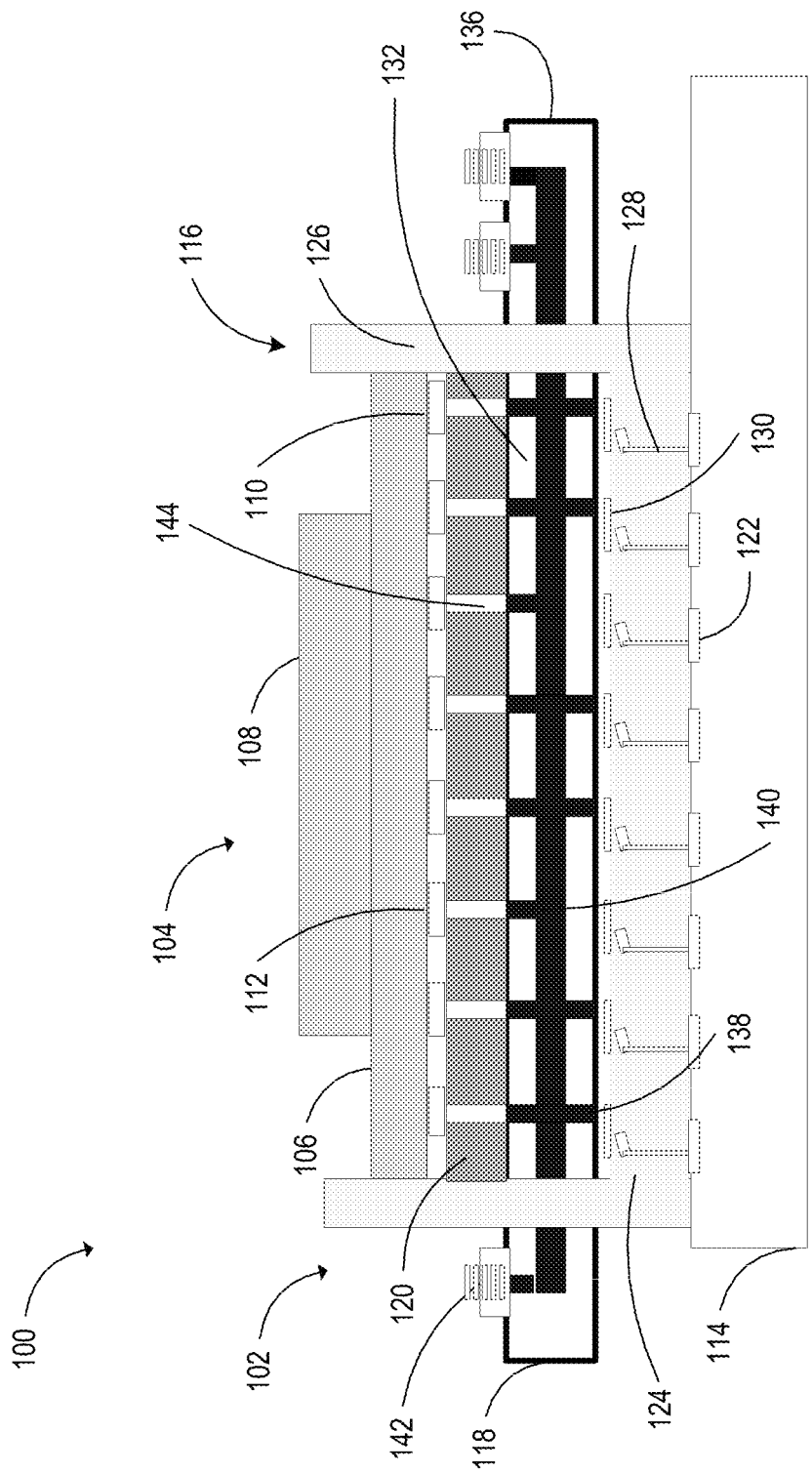
FIG. 1 is a block diagram representation of a side view of a system including an embodiment of an IC package coupled to an embodiment of a validation framework is shown.

Referring to FIG. 1, a block diagram representation of a side view of a system 100 including an IC package 104 coupled to an embodiment of a validation framework 102 is shown. The IC package 104 is removeably coupled to the validation framework 102. The validation framework 102 is configured to perform validation of the IC package 104. For example, a first IC package 104 may be coupled to the validation framework 102. Following the validation of the first IC package 104, the first IC package 104 may be replaced by a second IC package 104 for validation.

Examples of validation include, but are not limited to, monitoring, testing, debugging, verification, diagnosis, and other tasks associated with the validation of the IC package 104. Examples of IC packages 104 include, but are not limited to, a chip scale package (CSP), a wafer-level package (WLP), a stacked IC package, a system-in-package (SiP), a multi-chip package (MCP), a quad-flat no leads (QFN) package, a dual-flat no leads (DFN) package, a flip chip package, land grid array (LGA) package, and a ball grid array (BGA) package. In an embodiment, the IC package 104 is a central processing unit (CPU) IC package.

In an embodiment, the validation framework 102 is configured to perform validation of IC packages 104 associated with a specific IC package product. In an embodiment, the validation framework 102 is configured to perform validation of different generations of IC packages 104 of a specific IC package product. In an embodiment, the validation framework 102 is configured to perform validation of IC packages of different IC package products having electrical connections that are compatible with the electrical connections of the validation framework 102. For example, a first IC package 104 may be different than a second IC package 104 with different functions but both the first IC package 104 and the second IC package 104 may have electrical connections that are compatible with the electrical connections of the validation framework 102.

The IC package 104 includes one or more dies (not shown) disposed on a package substrate 106. In an embodiment, the IC package 104 includes an integrated heat spreader 108. Examples of dies include, but are not limited to, a central processing unit (CPU), a graphic processing unit (GPU), a memory chip, a phase-locked loop (PLL) chip, an input/output (I/O) interface chip, an application specific integrated circuit (ASIC), a field-programmable gate array, a package-embedded memory, a random access memory, a flash memory, an embedded non-volatile memory, a graphics card, a III-V die, an accelerator, a capacitor, a passive component, an inductor, an active component, a three-dimensional IC (3D IC), a high-bandwidth memory (HBM), a double data rate (DDR) memory, and a mmWave antenna module.

The package substrate 106 of the IC package 104 includes a set of IC functional contacts 110 and a set of IC validation contacts 112. The IC validation contacts 112 are dedicated to the performance of validation of the IC package 104. The IC functional contacts 110 and the IC validation contacts 112 are used to electrically couple the IC package 104 to the validation framework 102 for the validation of the IC package 104. The IC validation contacts 112 may not provide any value to a customer. The IC functional contacts 110 may eventually be used to electrically couple the IC package 104 to a customer platform. Alternative embodiments of the IC package 104 may include a greater or a fewer number of IC functional contacts 110 and/or a greater or a fewer number of IC validation contacts 112 than shown in FIG. 1.

In an embodiment, the IC functional contacts 110 and the IC validation contacts 112 are land grid array (LGA) pads. In an embodiment, the IC validation contacts 112 are disposed along a periphery of the package substrate 106. The IC contacts 110, 112 are arranged in a pattern on the IC package substrate 106. In an embodiment, the IC functional contacts 110 are arranged in a first pattern on the package substrate 106 and the IC validation contacts 112 are arranged in a second pattern on the package substrate 106. In an embodiment, the IC functional contacts 110 and the IC validation contacts 112 are arranged in a pattern that is specific to an IC package 104 product. In an embodiment, different generations of an IC package 104 product may have the IC functional contacts 110 and the IC validation contacts 112 are arranged in a pattern that that is specific to the IC package 104 product. In an embodiment, different IC package 104 products may have the IC functional contacts 110 and the IC validation contacts 112 arranged in a similar pattern.

The validation framework 102 includes a reference platform 114, an integrated circuit (IC) socket 116, an interposer 118, and an interface socket 120. In an embodiment, the reference platform 114 may be similar to a customer platform that a customer is expected to eventually use with the IC package 104. In an embodiment, the reference platform 114 is similar to a motherboard configured to host a CPU IC package. In an embodiment, the reference platform 114 is a printed circuit board (PCB). The reference platform 114 includes a plurality of platform pads 122. At least a subset of the platform pads 122 are arranged in the first pattern to correspond to the arrangement of the IC functional contacts 110 arranged in the first pattern on the IC package substrate 106 of the IC package 104. Alternative embodiments of the reference platform 114 may include a greater or a fewer number of platform pads 122 than shown in FIG. 1.

In an embodiment, different reference platforms 114 may be designed for specific IC package products. In an embodiment, different reference platforms 114 may be designed for different generations of IC packages 104 of a specific IC package product. In an embodiment, different reference platforms 114 may be designed for different IC package products having electrical connections that are compatible with the electrical connections of the validation framework 102.

The IC socket 116 includes a base 124 and a frame 126 extending from the base 124. The IC socket 116 includes a cavity defined by the base 124 and the frame 126. In an embodiment, the base 124 has one of a square shape and a rectangular shape. In an embodiment, the frame 126 has one or more openings extending through the frame 126. The base 124 includes a set of IC socket interconnects 128. The IC socket interconnects 128 have a first end on a first side of the base 124 within the interior of the cavity and a second end on a second side of the base 124, external to the IC socket 116. At least a subset of the IC socket interconnects 128 are arranged in the first pattern to correspond to the arrangement of the IC functional contacts 110 in the first pattern on the IC package substrate 106 of the IC package 104. Alternative embodiments of the IC socket 116 may include a greater or a fewer number of IC socket interconnects 128 than shown in FIG. 1.

The interposer 118 has an atypical shape. In an embodiment, the interposer 118 includes a cavity portion 132, one or more neck portions 134 (shown in FIG. 2), and one or more peripheral portions 136. The one or more neck portions 134 and the one or more peripheral portions 136 may be referred to as external portions of the interposer 118. The cavity portion 132 of the interposer 118 is disposed within the cavity of the IC socket 116 adjacent to the base 124 of the IC socket 116. The cavity portion 132 of the interposer 118 includes a set of interposer functional interconnects 138 and a set of interposer validation interconnects 140. The set of interposer functional interconnects 138 are arranged in the first pattern to correspond to the arrangement of the IC functional contacts 110 in the first pattern on the IC package substrate 106 of the IC package 104. The set of interposer validation interconnects 140 are arranged in the second pattern to correspond to the arrangement of the IC validation contacts 112 in the second pattern on the IC package substrate 106 of the IC package 104. Alternative embodiments of the interposer 118 may include a greater or a fewer number of interposer functional interconnects 138 and/or a greater or a fewer number of interposer validation interconnects 140 than shown in FIG. 1.

One or more validation connectors 142 are disposed on each of the one or more peripheral portions 136 of the interposer 118. In an embodiment, the one or more validation connectors 142 are disposed on an upper surface of one or more of the peripheral portions 136 of the interposer 118. In an embodiment, some of the one or more validation connectors 142 are disposed on an upper surface of one or more of the peripheral portions 136 of the interposer 118 and some of the one or more validation connectors 142 are disposed on a lower surface of the one or more peripheral portions 136 of the interposer 118. Each of the interposer validation interconnects 140 are electrically coupled to one of the validation connectors 142. Alternative embodiments of the interposer 118 may include a greater or a fewer number of validation connectors 142 than shown in FIG. 1. In an embodiment, the validation connectors 142 provide an interface with measurement equipment.

The interface socket 120 includes a set of interface interconnects 144. The set of interface interconnects 144 are arranged in a pattern to correspond to the arrangement pattern of the IC contacts 110, 112 on the package substrate 106 of the IC package 104. In an embodiment, the interface socket 120 is a removeable socket. In an embodiment, the interface socket 120 is an elastomer socket. Alternative embodiments of the interface socket 120 may include a greater or a fewer number of interface interconnects 144 than shown in FIG. 1.

As mentioned above, the validation framework 102 includes the reference platform 114, the IC socket 116, the interposer 118, and the interface socket 120. The IC socket 116 is coupled to the reference platform 114. In an embodiment, the second end of each of the IC socket interconnects 128 is directly electrically coupled to a corresponding one of the platform pads 122 of the reference platform 114. In an embodiment, the second end of a subset of the IC socket interconnects 128 is directly electrically coupled to a corresponding one of the platform pads 122 of the reference platform 114.

The cavity portion 132 of the interposer 118 is disposed within the cavity of the IC socket 116 adjacent to the base 124 of the IC socket 116. Each of the one or more neck portions 134 of the interposer 118 extends through one of the openings extending through the frame 126 of the IC socket 116. Each of the one or more peripheral portions 136 of the interposer 118 extend from an associated neck portion 134. Each interposer functional interconnect 138 extends from a first end at an upper surface of the interposer 118 through the interposer 118 to a second end at a lower surface of the interposer 118. The lower surface of the interposer 118 is disposed adjacent the base 124 of the IC socket 116. In an embodiment, the second end of each of the interposer functional interconnects 138 are directly electrically coupled to a first end of a corresponding one of the IC socket interconnects 128. In an embodiment, a contact pad 130 is electrically coupled to the second end of each interposer functional interconnect 138. In an embodiment, the contact pad 130 is an LGA pad. In an embodiment, the second end of each of the interposer functional interconnects 138 are directly electrically coupled to a first end of a corresponding one of the IC socket interconnects 128 via a contact pad 130.

The interface socket 120 is disposed within the cavity of the IC socket 116 adjacent the cavity portion 132 of the interposer 118. Each of the interface interconnects 144 is directly electrically coupled to a corresponding one of the interposer interconnects 138, 140. In an embodiment, the interface socket 120 is removeably attached to the cavity portion 132 of the interposer 118. In an embodiment, mechanical pressure is used to achieve electrical coupling between each of the interface interconnects 144 and the corresponding one of the interposer interconnects 138, 140.

The IC package 104 is electrically coupled to the validation framework 102 to perform validation of the IC package 104. To establish electrical coupling between the IC package 104 and the validation framework 102, the package substrate 106 of the IC package 104 is positioned adjacent to the interface socket 120 such that each of the IC contacts 110, 112 are aligned with and electrically coupled to a corresponding one of the interface interconnects 144. In an embodiment, mechanical pressure is used to achieve electrical coupling between each of the IC contacts 110, 112 and the corresponding one of the interface interconnects 144.

When the IC package 104 is electrically coupled to the validation framework 102, each of the IC functional contacts 112 is electrically coupled to a corresponding one of the platform pads 122 on the reference platform 114 via an interface interconnect 144, an interposer functional interconnect 138, and an IC socket interconnect 128 and each of the IC validation contacts 112 is electrically coupled to a validation connector 142 via the an interface interconnect 144 and an interposer validation interconnect 140. During the validation process, validation signals of the IC package 104 dedicated to validating the intended function of the IC package 104 by monitoring the operation of the IC package 104 are routed to the validation connectors 142. While the validation framework 102 has been described as including the components described above, the validation framework 102 may include additional components to facilitate operation of the validation framework 102.

Figure 2:
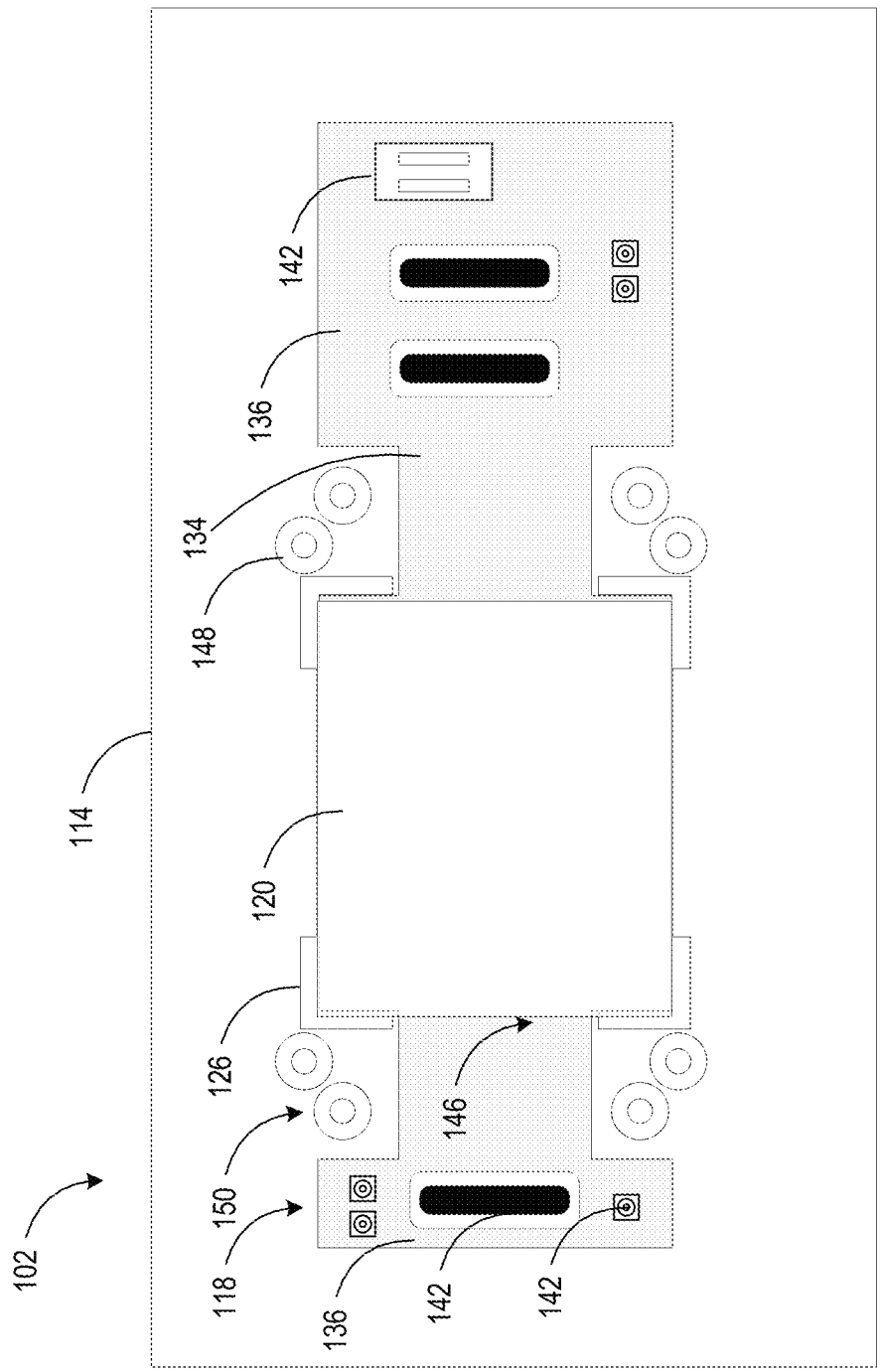
FIG. 2 is a block diagram representation of a top view of the embodiment of the validation framework of FIG. 1.

Referring to FIG. 2, is a block diagram representation a top view of the embodiment of the validation framework 102 of FIG. 1 is shown. The validation framework 102 includes the reference platform 114, the IC socket 116, the interposer 118, and the interface socket 120. In an embodiment, the frame 126 of the IC socket 116 is defined by four corner portions that extend from the base 124. The frame 126 and includes four openings 146. Each opening 146 extends through the frame 126 and between adjacent corner portions of the frame 126. In an embodiment, the base 124 has a rectangular shape. In an embodiment, the base 124 has a square shape. In alternative embodiments, the base 124 may have other shapes. The reference platform 114 includes one or more mechanical obstacles 148. In an embodiment, the mechanical obstacles are screws 148. Other examples of mechanical obstacles include, but are not limited to, other components on the reference platform 114, components on the reference platform 114 associated with thermal solutions (e.g. chiller plates), components on the reference platform 114 associated with mechanical solutions (e.g. bolster plates), and component keep out zones (KOZs).

Figure 3:
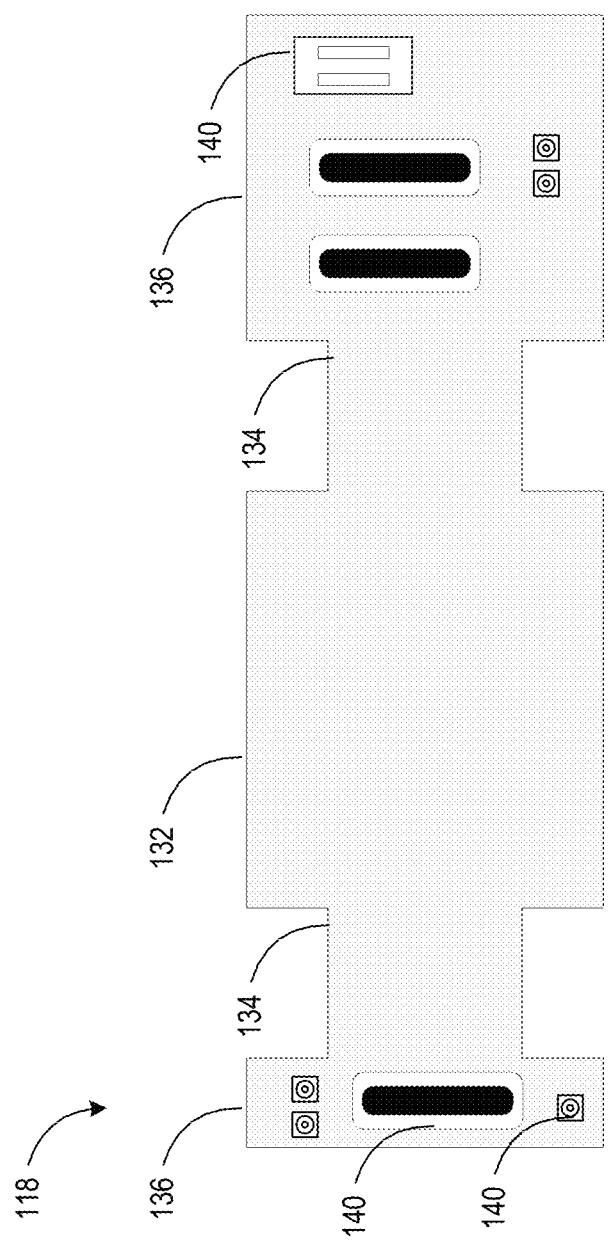
FIG. 3 is a block diagram representation of a top view of the embodiment of the interposer of FIG. 2.

The interposer 118 has an atypical shape. A block diagram representation of a tope view of the embodiment of the interposer 118 of FIG. 2 is shown is shown in FIG. 3. The interposer 118 is described with reference to FIG. 2 and FIG. 3. In an embodiment, the interposer 118 includes the cavity portion 132, first and second neck portions 134, and first and second peripheral portions 136. The cavity portion 132 is disposed within the IC socket 116 adjacent to the base 124 of the IC socket 116. The first and second neck portions 134 and the first and second peripheral portions 136 may be referred to as external portions of the interposer 118. The first and second neck portions 134 extend from opposing sides of the cavity portion 132. Each neck portion 134 extends through an opening 146 of the frame 126 of the IC socket 116. The first and second peripheral portions 136 extend from the first and second neck portions 134, respectively. In an embodiment, different neck portions 134 may have different lengths and/or different widths. In an embodiment, different neck portions 134 may have similar lengths and/or widths. In an embodiment, different peripheral portions 136 may have different lengths and/or different widths. In an embodiment, different peripheral portions 136 may have similar lengths and/or widths. While one configuration of an interposer 118 having an atypical shape has been described, alternative embodiments of the interposer 118 may includes a greater or few number of neck portions 134 and/or a greater or fewer number of peripheral portions 136. In alternative embodiments, the neck portions 134 may extend through different openings in the frame 126 than what is shown in FIG. 2. For example, first and second neck portions 134 may extend through adjacent openings in the frame 126.

The interposer 118 has a width and a length. In an embodiment, the width of the interposer 118 defined by a width of the cavity of the IC socket 116. In an embodiment, a width of the neck portion 134 of the interposer 118 is defined by a width of the opening of the frame 126 of the IC socket 116. In an embodiment, a width of the neck portion 134 of the interposer 118 is less than the width of the opening of the frame 126 of the IC socket 116. In an embodiment, the interposer 118 includes one or more cutouts 150 along the length of the interposer 118. The one or more cutouts 150 are defined by the one or more mechanical obstacles 148 disposed on the reference platform 114. In an embodiment, the one or more cutouts 150 are disposed along the length of the interposer 118 between the cavity portion 132 and the peripheral portions 136. In an embodiment, a length of each of the one or more neck portions 134 is defined by the one or more mechanical obstacles disposed on the reference platform 114. In an embodiment, the one or more cutouts 150 may be disposed along a length of the one or more of the peripheral portions 136. In an embodiment, the one or more cutouts 150 may be disposed along a width of the one or more of the peripheral portions 136.

One or more validation connectors 142 are disposed on the first and second peripheral portions 136. In an embodiment, different types of validation connectors 142 may be disposed on each of the first and second peripheral portions 136. Alternative embodiments of the reference platform 114 may include a greater or a fewer number of mechanical obstacles than shown in FIG. 2. Alternative embodiments of the interposer 118 may include a greater or a fewer number of cutouts 150 than shown in FIG. 2 and FIG. 3. Alternative embodiments of the interposer 118 may include a greater or a fewer number of validation connectors 140 than shown in FIG. 2 and FIG. 3.

Figure 4:
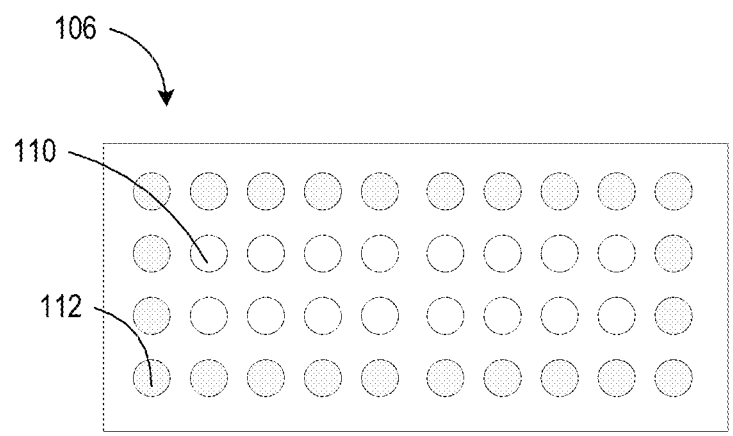
FIG. 4 is a block diagram representation of a bottom view of an example of a package substrate of an IC package in including IC functional contacts arranged in a first pattern and IC validation contacts arranged in a second pattern.

Referring to FIG. 4, a block diagram representation of a bottom view of an example of a package substrate 106 of an IC package 104 in including IC functional contacts 110 arranged in a first pattern and IC validation contacts 112 arranged in a second pattern is shown. In an embodiment, the IC validation contacts 112 are arranged in a first pattern along a periphery of the package substrate 106. The IC validation contacts 112 are dedicated to the performance of validation of the IC package 104. The IC functional contacts 110 and the IC validation contacts 112 are used to electrically couple the IC package 104 to the validation framework 102 to perform the validation of the IC package 104. When the IC package 104 is electrically coupled to the validation framework 102, each of the IC validation contacts 112 are electrically coupled to one of the validation connectors 142 and each of the IC functional contacts 110 is electrically coupled to the reference platform 114. The IC functional contacts 110 may eventually be used to electrically couple the IC package 104 to a customer platform. Alternative embodiments of the IC package 104 may include a greater or a fewer number of IC functional contacts 110 and/or a greater or a fewer number of IC validation contacts 112 than shown in FIG. 4. Alternative embodiments of the IC package 104 may include IC functional contacts 110 arranged in a different first pattern and/or IC validation contacts 112 arranged in a different second pattern than shown in FIG. 4.

Figure 5:
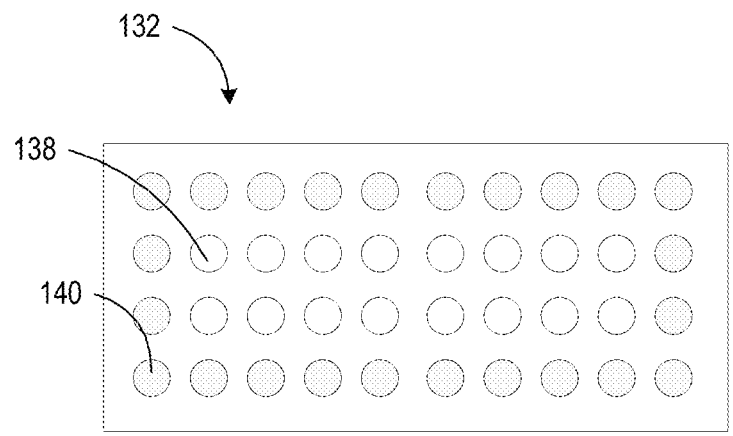
FIG. 5 a block diagram representation of a top view of a cavity portion of an embodiment of an interposer having interposer functional interconnects arranged the first pattern and the interposer validation interconnects arranged in the second pattern.

Referring to FIG. 5, a block diagram representation of a top view of a cavity portion 132 of an embodiment of an interposer 118 having interposer functional interconnects 138 arranged the first pattern and the interposer validation interconnects 140 arranged in the second pattern is shown. The arrangement of the interposer functional interconnects 138 in the first pattern correspond to the arrangement of the IC functional contacts 110 in the first pattern in FIG. 4. The arrangement of the interposer validation interconnects 140 arranged the second pattern correspond to the arrangement of the IC validation contacts 112 in the second pattern in FIG. 4. Alternative embodiments of the interposer 118 may include interposer functional interconnects 138 arranged in a different first pattern than shown in FIG. 4 where the arrangement of the interposer functional interconnects 138 corresponds to the arrangement of the IC functional contacts 110 on the package substrate 106 of the IC package 104. Alternative embodiments of the interposer 118 may include interposer validation interconnects 140 arranged in a different second pattern than shown in FIG. 4 where the arrangement of the interposer validation interconnects 140 corresponds to the arrangement of the IC validation contacts 112 on the package substrate 106 of the IC package 104.

Figure 6:
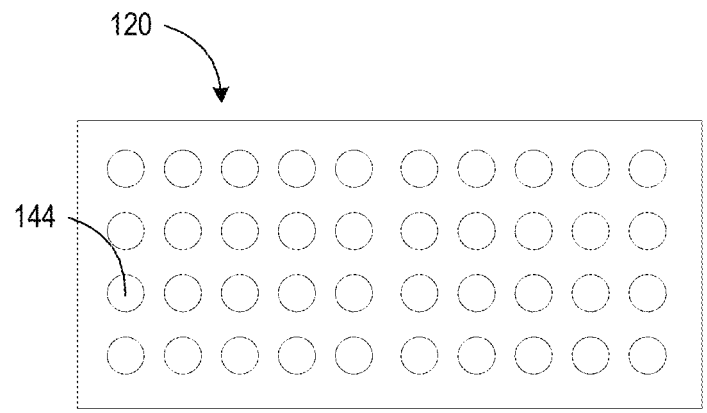
FIG. 6 is a block diagram representation of a top view of an embodiment of an interface socket having interface interconnects arranged in a pattern to provide electrical coupling between the IC contacts and the interposer interconnects.

Referring to FIG. 6, a block diagram representation of a top view of an embodiment of an interface socket 120 having interface interconnects 144 arranged in a pattern to provide electrical coupling between the IC contacts 110, 112 and the interposer interconnects 138, 140 is shown. The interface interconnects 144 are arranged in a pattern that corresponds to the arrangement of the IC functional contacts 110 in the first pattern and the arrangement of the IC validation contacts 112 in the second pattern on the package substrate 106 of the IC package 104 in FIG. 4. This enables the interface socket 120 to provide electrical coupling between the IC functional contacts 110 and the interposer functional interconnects 138 as well as between the IC validation contacts 112 and the interposer validation interconnects 140. Alternative embodiments of the interface socket 120 may include interface interconnects 144 arranged in a different pattern than shown in FIG. 6 where the arrangement of the interface interconnects 144 corresponds to the arrangement of the IC contacts 110, 112 on the package substrate 106 of the IC package 104.

Figure 7:
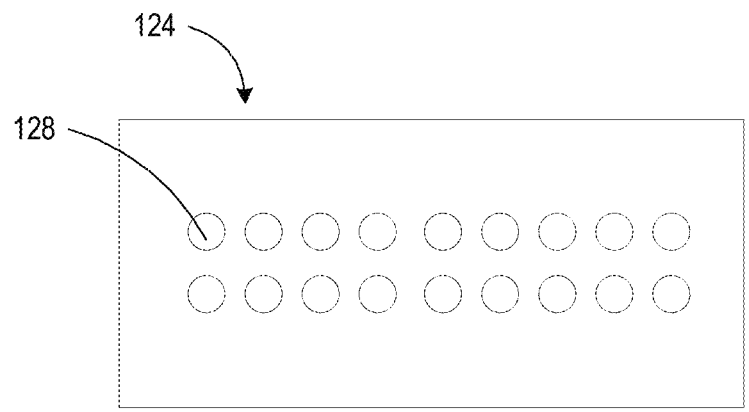
FIG. 7 is a block diagram representation of a top view of an embodiment of a base of an IC socket having active IC socket interconnects arranged in the first pattern to provide electrical coupling between the interposer functional interconnects and the platform pads of the reference platform.

Referring to FIG. 7, a block diagram representation of a top view of an embodiment of a base 124 of an IC socket 116 having active IC socket interconnects 128 arranged in the first pattern to provide electrical coupling between the interposer functional interconnects 138 and the platform pads 122 of the reference platform 114 is shown. The IC socket interconnects 128 are arranged in a pattern that corresponds to the arrangement of the IC functional contacts 110 on the package substrate 106 of the IC package 104 in FIG. 4. The IC socket interconnects 128 that are arranged in a pattern that corresponds to the arrangement of the IC functional contacts 110 may be referred to as active IC socket interconnects 128. In an embodiment, the IC socket 116 may include additional IC socket interconnects that are not used and can be referred to as inactive IC socket interconnects 128 (not shown). Alternative embodiments of the IC socket 116 may include active IC socket interconnects 128 arranged in a different pattern than shown in FIG. 7 where the arrangement of the active IC socket interconnects 128 corresponds to the arrangement of the IC functional contacts 110 on the package substrate 106 of the IC package 104.

Figure 8:
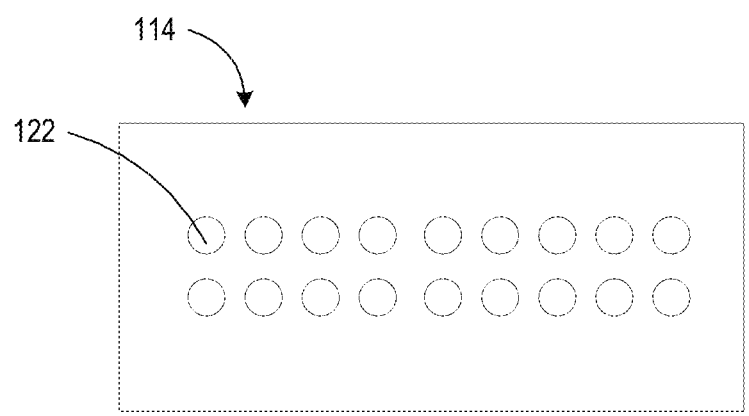
FIG. 8 is a block diagram representation of a top view of an embodiment of a reference platform having platform pads arranged in the first pattern to enable electrical coupling with the active IC socket interconnects arranged in the first pattern.

Referring to FIG. 8, a block diagram representation of a top view of an embodiment of a reference platform 114 having platform pads 122 arranged in the first pattern to enable electrical coupling with the active IC socket interconnects 128 arranged in the first pattern is shown. The platform pads 122 are arranged in the first pattern that corresponds to the arrangement of the active IC socket interconnects 128 in the first pattern shown if FIG. 7. The platform pads 122 that are arranged in the first pattern that corresponds to the arrangement of the active IC socket interconnects 128 may be referred to as active platform pads 122. In an embodiment, the reference platform 114 may include additional platform pads are not used and may be referred to as inactive platform pads (not shown). Alternative embodiments of the reference platform 114 may include active platform pads 122 arranged in a different pattern than shown in FIG. 8 where the arrangement of the active platform pads 122 corresponds to the arrangement of the IC functional contacts 110 on the package substrate 106 of the IC package 104.

Figure 9:
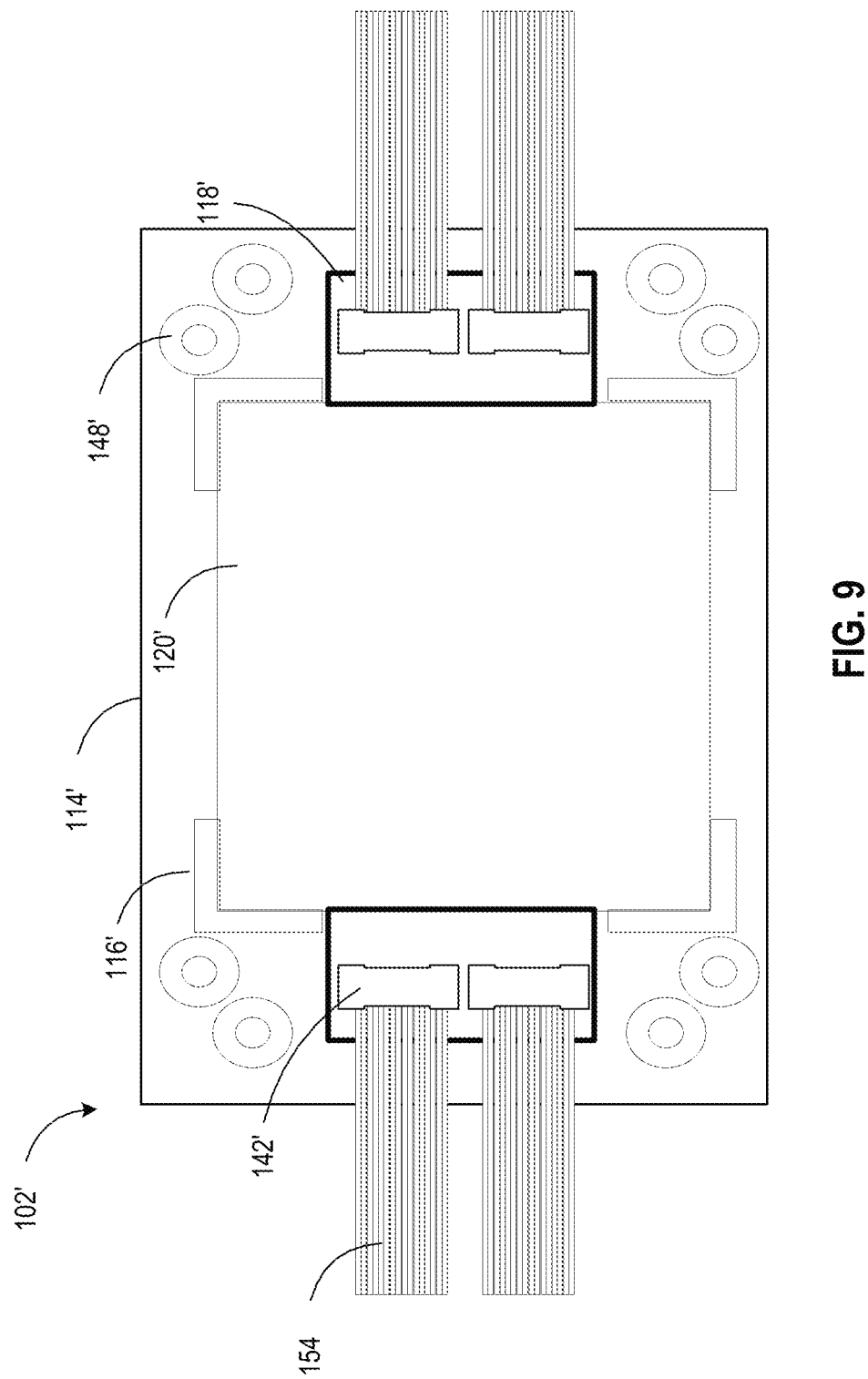
FIG. 9 is a block diagram representation of a top view of an embodiment of a validation framework.

Referring to FIG. 9, a block diagram representation of a top view of an embodiment of a validation framework 102' is shown. The validation framework 102' includes a reference platform 114', an IC socket 116', an interposer 118', and an interface socket 120'. The reference platform 114', the IC socket 116', and the interface socket 120' may be similar to the reference platform 114, the IC socket 116, and the interface socket 120 described above.

The reference platform 114' includes one or more mechanical obstacles 148. In an embodiment, the mechanical obstacles are screws 148. In an embodiment, the mechanical obstacles on the reference platform 114' are created by the addition of a bolster plate (not shown) to the validation framework 102'. The bolster plate is attached to the reference platform 114'. In an embodiment, the bolster plate includes first and second plates that are disposed on either side of the reference platform 114'. The bolster plate operates as a stiffener and maintains the reference platform 114' in a generally flat configuration by minimizing bending of the reference platform 114'. Bolster plates are typically constructed from stainless steel.

In an embodiment, the mechanical obstacles on the reference platform 114' are created by the addition of a chiller plate (not shown). In an embodiment, the chiller plate is disposed around the IC socket 116'. In an embodiment, the chiller plate is disposed on top of the reference platform 114'. In an embodiment, the chiller plate is disposed around the IC socket 116' on top of the reference platform 114'. The chiller plate operates to control the temperature of the IC package 104 during validation of the IC package 104. In an embodiment, the IC package 104 is a CPU IC package and the chiller plate controls the temperature of the CPU IC package during validation of the CPU IC package. The mechanical obstacles are created by the addition of one or both of the bolster plate and the chiller plate due to the thickness of the bolster plate and/or chiller plate.

Figure 10:
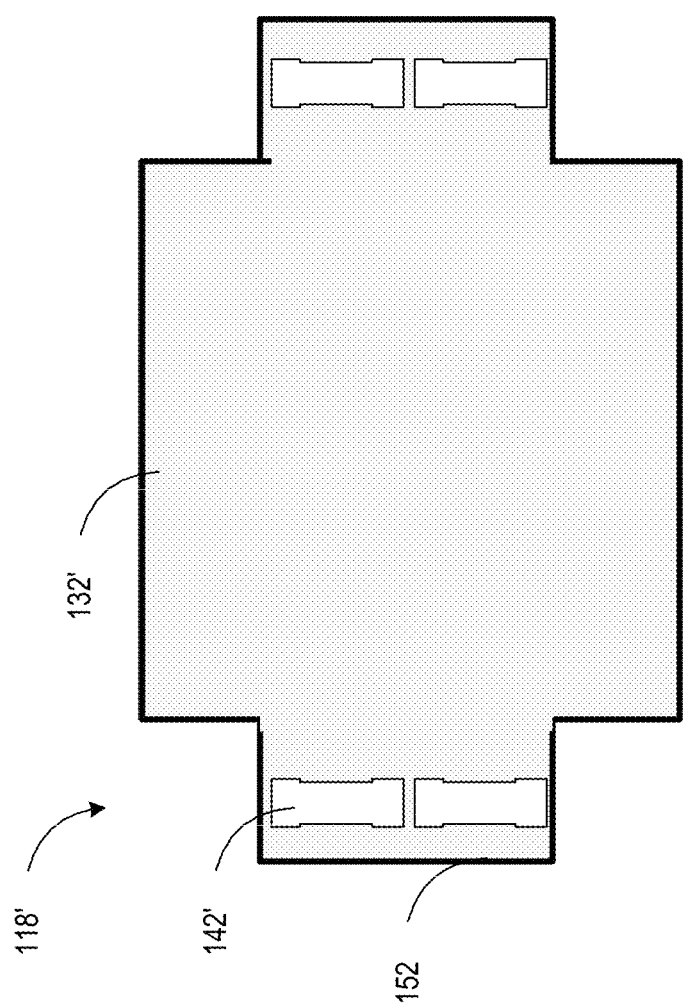
FIG. 10 is a block diagram representation of a top view of an embodiment of the interposer of FIG. 9.

The interposer 118' has an atypical shape. A block diagram representation of a tope view of the embodiment of the interposer 118' of FIG. 9 is shown is shown in FIG. 10. The interposer 118' is described with reference to FIG. 9 and FIG. 10. The interposer 118' includes a cavity portion 132' similar to the cavity portion 132 of the interposer 118 described above. The cavity portion 132' of the interposer 118' is disposed within the cavity of the IC socket 116' adjacent the base of the IC socket 116'. The interposer 118' includes one or more wing portions 152. The one or more wing portions 152 may be referred to as external portions of the interposer 118'. Each wing portion 152 extends through an opening of the frame of the IC socket 116'. In an embodiment, the interposer 118' includes first and second wing portions 152. The first and second wing portions 152 extend from opposing sides of the cavity portion 132' of the interposer 118'. The first and second wing portions 152 extend through opposing openings in the frame of the IC socket 116'. The first and second wing portions 152 are designed to avoid the mechanical obstacles created on the reference platform 114' by the addition of one or both of the bolster plate and the chiller plate. In an embodiment, the width of each wing portion 152 is defined by the width of the opening of the frame of the IC socket 116'.

One or more validation connectors 142' are disposed on the first and second wing portions 152. In an embodiment, the validation connectors 142' are similar to the validation connectors 142 described above. In an embodiment, each wing portion 152 includes one or more high density validation connectors 142'. In an embodiment, the high density validation connector 142' is a micro coaxial connector. In an embodiment, one or more high density validation connectors 142' are disposed on an upper side of the wing portion 152 of the interposer 118'. In an embodiment, one or more high density validation connectors 142' are disposed on an upper side of the wing portion 152 of the interposer 118' and one or more high density validation connectors 142' are disposed on a lower side of the wing portion 152 of the interposer 118'. In an embodiment, the high density validation connectors 142' are configured to be coupled to high density cables 154. In the embodiment, the micro coaxial connectors are configured to be coupled to micro coaxial cables. High density validation connectors 142' may have a bandwidth of 40 Ghz and high pin density of up to 60 pins or a higher number of pins.

Figure 11:
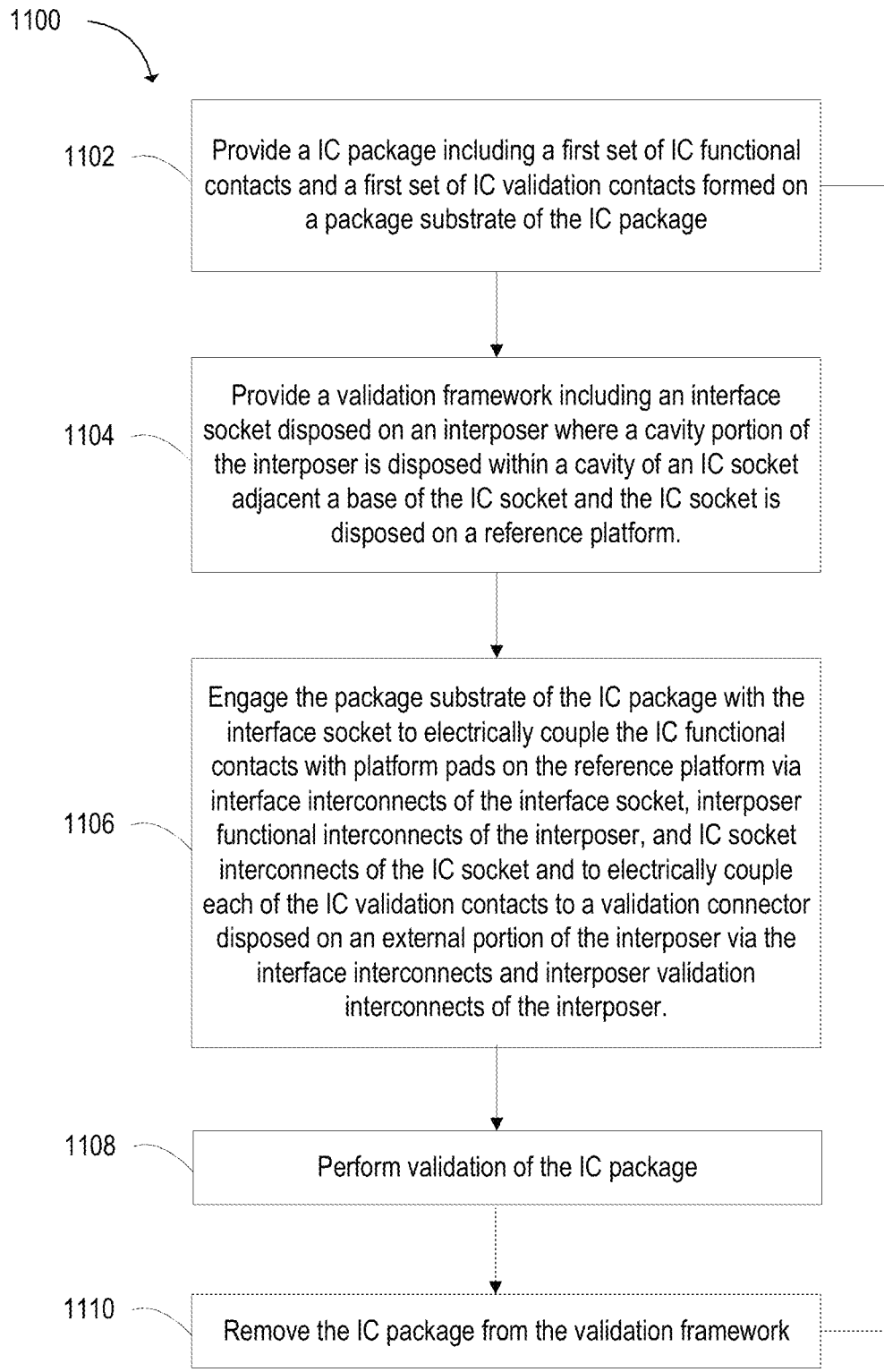
FIG. 11 is a flowchart representation of a method of validating an IC package using an embodiment of a validation framework including an atypical interposer.

Referring to FIG. 11, a flowchart representation of a method 1100 of validating an IC package 104 using an embodiment of a validation framework 102, 102' is shown. At 1102, an IC package 104 including a first set of IC functional contacts 110 and a first set of IC validation contacts 112 formed on a package substrate 106 of the IC package 104 is provided. At 1104, a validation framework 102, 102' including an interface socket 120, 120' disposed on an interposer 118, 118' where a cavity portion 132, 132' of the interposer 118, 118' is disposed within a cavity of an IC socket 116, 116' adjacent a base of the IC socket 116, 116' and the IC socket 116, 116' is disposed on a reference platform 114, 114' is provided.

At 1106, the package substrate 106 of the IC package 104 is engaged with the interface socket 120, 120' to electrically couple the IC functional contacts 110 with platform pads 122 on the reference platform 114, 114' via interface interconnects 144 of the interface socket 120, 120', interposer functional interconnects 138 of the interposer 118, 118', and IC socket interconnects 128 of the IC socket 116, 116' and to electrically couple each of the IC validation contacts 112 to a validation connector 142, 142' disposed on an external portion 136, 152 of the interposer 118, 118' via the interface interconnects 144 and interposer validation interconnects 140 of the interposer 118, 118'. At 1108, perform validation of the IC package 104. At 1110, remove the IC package 104 from the validation framework 102, 102'. The method 1100 then returns to 1102 where a second IC package is provided for validation.

While the validation framework 102, 102' has been described in connection with performing validation of IC packages 104, in an alternative embodiment, a permanent framework may be configured similarly to the validation framework 102. The permanent framework may be used as a permanent component of an IC package. Examples of such IC packages include, but are not limited to, voltage regulator IC packages and memory IC packages. The use of an atypical interposer in a permanent framework may create additional real estate for electrical connector associated with such IC packages.

The use of an atypical shaped interposer eliminates the use of a riser in a validation framework. This may result in a reduction in deviations from reference designs, a reduction in the cost of the validation framework, and an increase in the ability of the system to operate at higher performance levels. A higher compatibility with reference design may be achieved. The stack up features of the interposer, such as thickness, number of layers, and dielectric materials of the interposer may be selected based on mechanical requirements and a number of signals to be routed. The number of signals to be routed may influence the number and type of validation connectors used in the validation framework. In addition, alignment tolerances may be reduced by removing the riser from the validation framework. The use of an atypical shape interposer may provide flexibility to adapt to multiple scenarios where a typical interposer may have a greater impact on system performance during validation.

Figure 12:
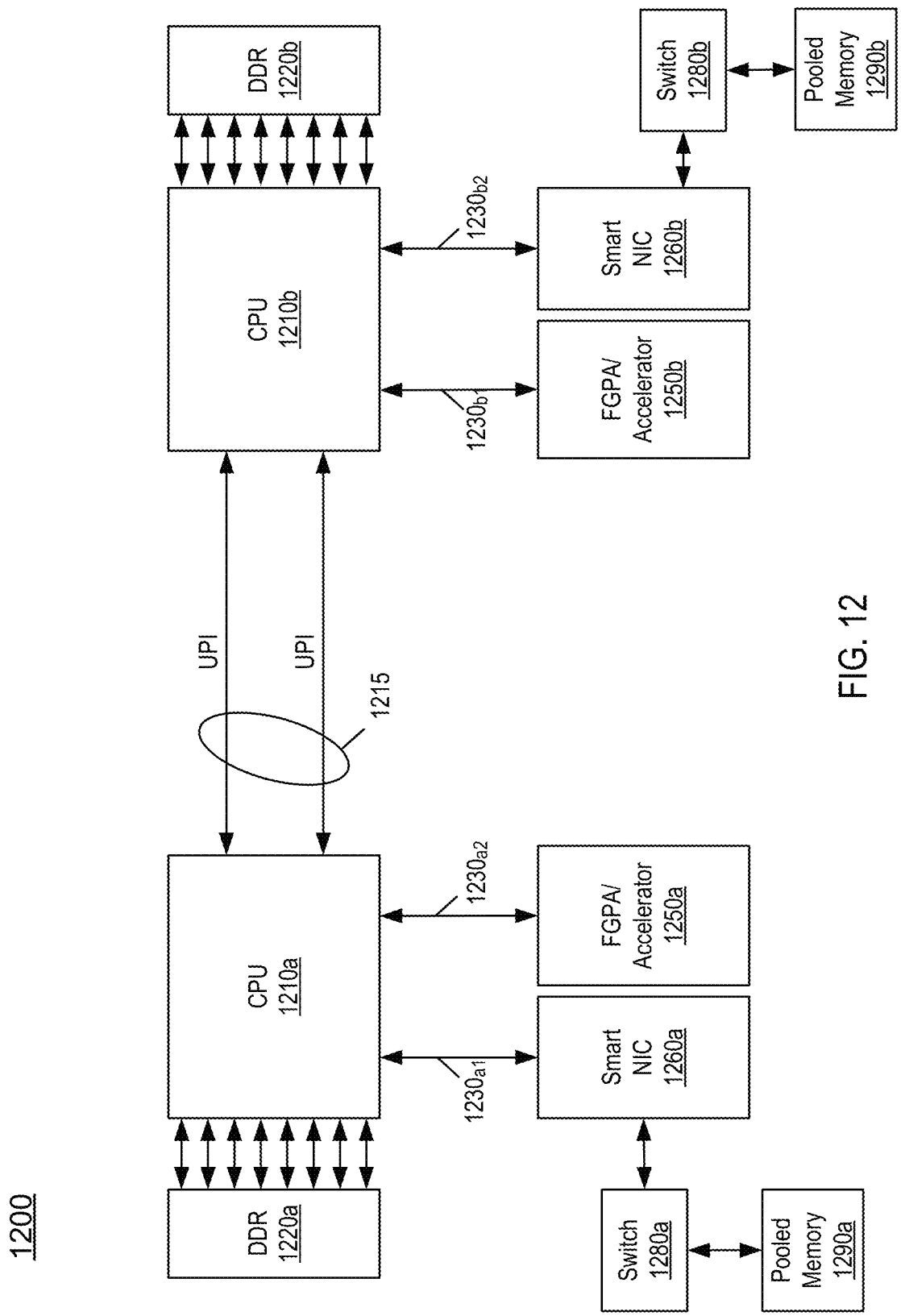
FIG. 12 is a block diagram representation of a system in accordance with an embodiment.

Referring now to FIG. 12, a block diagram representation of a system 1200 in accordance with an embodiment is shown. The system 1200 may be any type of computing device, and in one embodiment may be a server system such as an edge platform. One or more components of the system 1200 may be or include IC packages 104 may be configured with IC functional contacts 110 and IC validation contacts 112 that are compatible with an embodiment of validation framework 102, 102' to enable performance of validation of the IC packages 140. In the embodiment of FIG. 12, system 1200 includes multiple CPUs 1210a, 1210b that in turn couple to respective system memories 1220a, 1220b which in embodiments may be implemented as double data rate (DDR) memory. Note that CPUs 1210 may couple together via an interconnect system 1215 such as an Intel® Ultra Path Interconnect or other processor interconnect technology.

To enable coherent accelerator devices and/or smart adapter devices to couple to CPUs 1210 by way of potentially multiple communication protocols, a plurality of interconnects 1230a1-b2 may be present. In an embodiment, each interconnect 1230 may be a given instance of a CXL link.

In the embodiment shown, respective CPUs 1210 couple to corresponding field programmable gate arrays (FPGAs)/accelerator devices 1250a, 1250b (which may include graphics processing units (GPUs), in one embodiment. In addition CPUs 1210 also couple to smart network interface circuit (NIC) devices 1260a, 1269b. In turn, smart NIC devices 1260a, 1260b couple to switches 1280a, 1260b (e.g., CXL switches in accordance with an embodiment) that in turn couple to a pooled memory 1290a, 1290b such as a persistent memory. With an arrangement as in FIG. 12, CPUs 1210 may direct information of multiple communication protocols (e.g., CXL.cache and CXL.memory protocol traffic) via a selected one of flit or non-flit modes as described herein to devices 1250. As shown information can be stored in a pooled memory 1290. In turn, CPUs 1210 or other entities may access and further process this information from pooled memory 1290.

Figure 13:
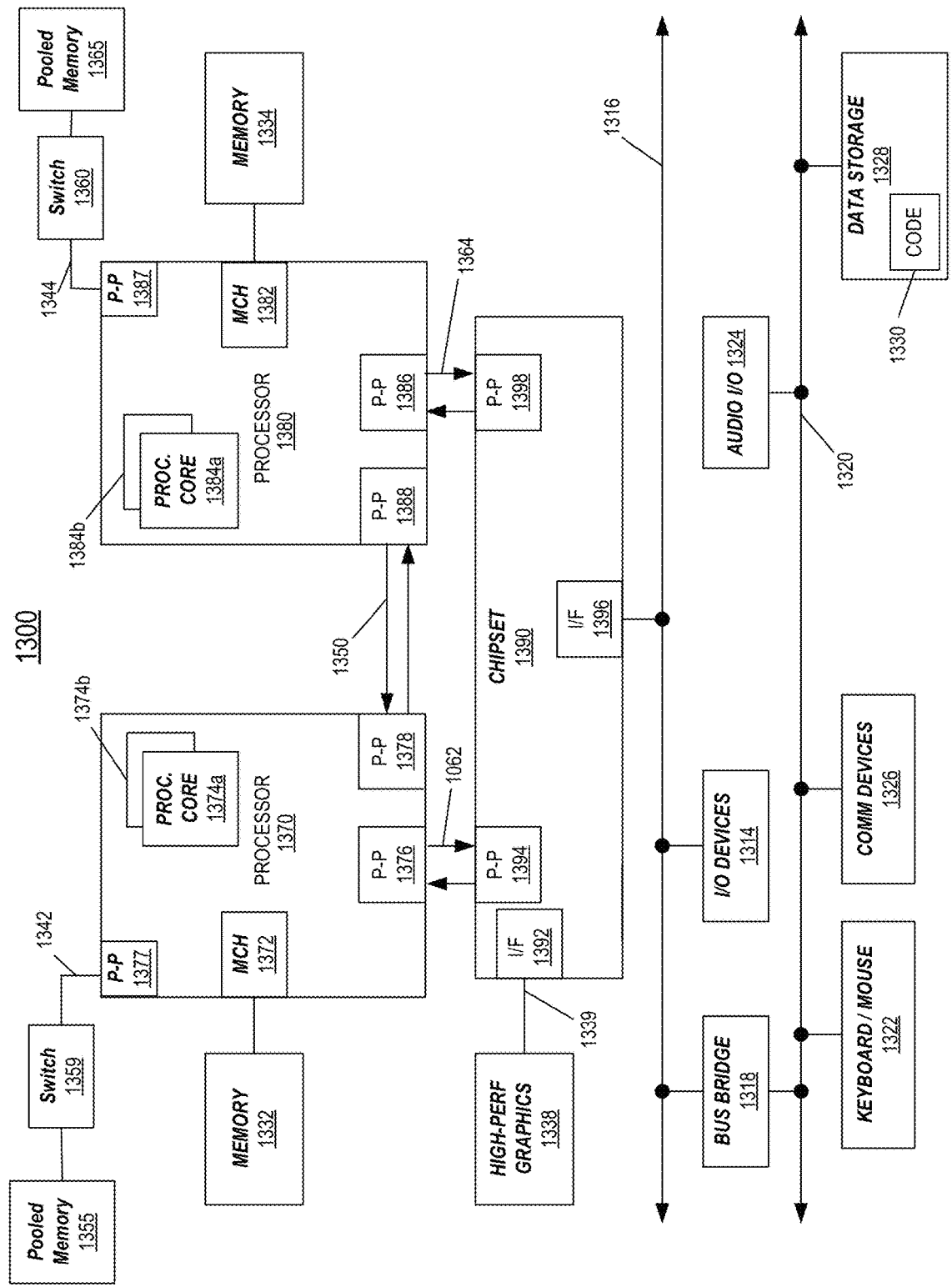
FIG. 13 is a block diagram representation of a system in accordance with an embodiment.

Referring now to FIG. 13, a block diagram representation of a system 1300 in accordance with an embodiment such as an edge platform is shown. One or more components of the system 1300 may be or include IC packages 104 may be configured with IC functional contacts 110 and IC validation contacts 112 that are compatible with an embodiment of validation framework 102, 102' to enable performance of validation of the IC packages 140. As shown in FIG. 13, multiprocessor system 1300 includes a first processor 1370 and a second processor 1380 coupled via a point-to-point interconnect 1350. As shown in FIG. 13, each of processors 1370 and 1380 may be many core processors including representative first and second processor cores (i.e., processor cores 1374a and 1374b and processor cores 1384a and 1384b). In the embodiment of FIG. 13, processors 1370 and 1380 further include point-to point interconnects 1377 and 1387, which couple via interconnects 1342 and 1344 (which may be CXL buses) to switches 1359 and 1360. Such traffic may be according to multiple protocols, including CXL.cache and CXL.memory protocol traffic via a selected one of flit or non-flit modes as described herein. In turn, switches 1359, 1360 couple to pooled memories 1355 and 1365.

Still referring to FIG. 13, first processor 1370 further includes a memory controller hub (MCH) 1372 and point-to-point (P-P) interfaces 1376 and 1378. Similarly, second processor 1380 includes a MCH 1382 and P-P interfaces 1386 and 1388. As shown in FIG. 13, MCH's 1372 and 1382 couple the processors to respective memories, namely a memory 1332 and a memory 1334, which may be portions of system memory (e.g., DRAM) locally attached to the respective processors. First processor 1370 and second processor 1380 may be coupled to a chipset 1390 via P-P interconnects 1376 and 1386, respectively. As shown in FIG. 13, chipset 1390 includes P-P interfaces 1394 and 1398.

Furthermore, chipset 1390 includes an interface 1392 to couple chipset 1390 with a high performance graphics engine 1338, by a P-P interconnect 1339. As shown in FIG. 13, various input/output (I/O) devices 1314 may be coupled to first bus 1316, along with a bus bridge 1318 which couples first bus 1316 to a second bus 1320. Various devices may be coupled to second bus 1320 including, for example, a keyboard/mouse 1322, communication devices 1326 and a data storage unit 1328 such as a disk drive or other mass storage device which may include code 1330, in one embodiment. Further, an audio I/O 824 may be coupled to second bus 1320.

Figure 14:
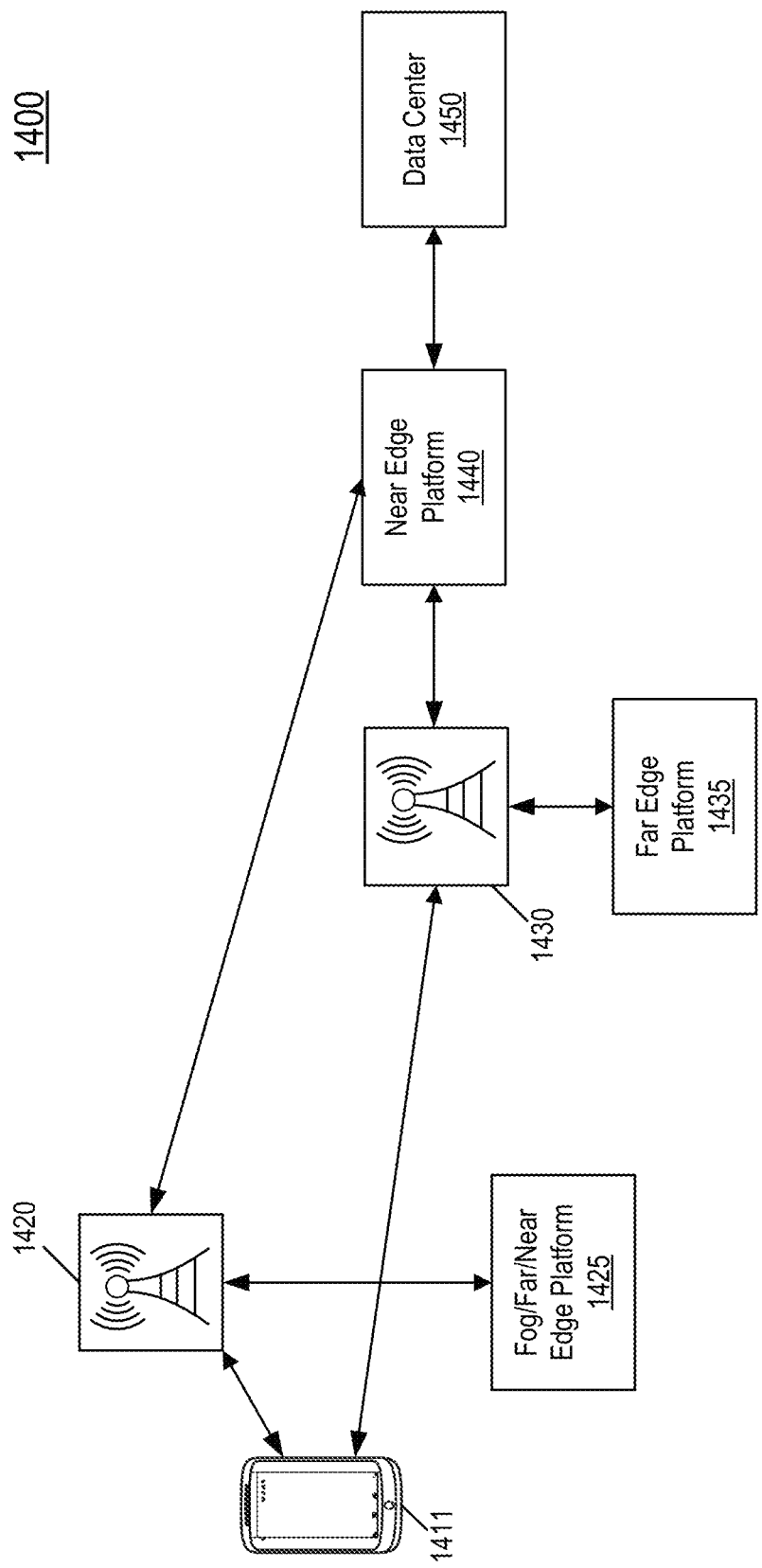
FIG. 14 is a block diagram representation of a network architecture in accordance with an embodiment.

Embodiments as described herein can be used in a wide variety of network architectures. To this end, many different types of computing platforms in a networked architecture that couples between a given edge device and a datacenter can communicate in the flit or non-flit modes described herein. Referring now to FIG. 14, shown is a block diagram of a network architecture in accordance with another embodiment of the present invention. As shown in FIG. 14, network architecture 1400 includes various computing platforms that may be located in a very wide area, and which have different latencies in communicating with different devices.

In the high level view of FIG. 14, network architecture 1400 includes a representative device 1411, such as a smartphone. One or more components of the network architecture may be or include IC packages 104 may be configured with IC functional contacts 110 and IC validation contacts 112 that are compatible with an embodiment of validation framework 102, 102' to enable performance of validation of the IC packages 140. This device may communicate via different radio access networks (RANs), including a RAN 1420 and a RAN 1430. RAN 1420 in turn may couple to a platform 1425, which may be an edge platform such as a fog/far/near edge platform, and which may leverage embodiments herein. Other requests may be handled by a far edge platform 1435 coupled to RAN 1430, which also may leverage embodiments.

As further illustrated in FIG. 14, another near edge platform 1440 may couple to RANs 1420, 1430. Note that this near edge platform may be located closer to a data center 1450, which may have a large amount of computing resources. By pushing messages to these more remote platforms, greater latency is incurred in handling requests on behalf of edge device 1411. Understand that all platforms shown in FIG. 14 may incorporate embodiments as described herein to communicate, e.g., PCIe, CXL.cache and CXL.memory protocol traffic in flit and/or non-flit modes as described herein.

The following examples pertain to further embodiments.

In one example, an apparatus includes: an integrated circuit (IC) socket having a cavity to receive an IC package comprising first and second sets of IC contacts, the cavity defined by a base comprising a set of IC socket interconnects and a frame extending from the base with at least one opening through the frame; and an interposer comprising: a cavity portion disposed adjacent the base of the IC socket; an external portion extending from the cavity portion through one of the at least one opening; at least one connector disposed on the external portion; a first set of interposer interconnects to electrically couple each of the first set of IC contacts with a corresponding one of the set of IC socket interconnects; and a second set of interposer interconnects to electrically couple each of the second set of IC contacts with one of the at least one connector.

In an example, the first set of interposer interconnects comprise a set of interposer functional interconnects, each to electrically couple with a corresponding one of the first set of IC contacts, the first set of IC contacts comprising a set of IC functional contacts.

In an example, the second set of interposer interconnects comprise a set of interposer validation interconnects, each to electrically couple with a corresponding one of the second set of IC contacts, the second set of IC contacts comprising a set of IC validation contacts.

In an example, the first set of interposer interconnects are arranged in a first pattern, each to electrically couple with a corresponding one of the first set of IC contacts arranged in the first pattern.

In an example, the second set of interposer interconnects are arranged in a second pattern, each to electrically couple with a corresponding one of the second set of IC contacts arranged in the second pattern.

In an example, the second set of interposer interconnects are disposed along a periphery of the cavity portion of the interposer, each to electrically couple with a corresponding one of the second set of IC contacts disposed along a periphery of the IC package.

In an example, the apparatus further includes an interface socket disposed on top of the cavity portion of the interposer to removeably engage the IC package, the interface socket comprising a set of interface interconnects to electrically couple each of the first set of IC contacts with a corresponding one of the first set of interposer interconnects and to electrically couple each of the first second set of IC contacts with a corresponding one of the second set of interposer interconnects.

In an example, the interface socket comprises a flexible pressure fit socket.

In an example, the external portion of the interposer comprises a neck portion extending from the cavity portion and a peripheral portion extending from the neck portion, the at least one connector disposed on the peripheral portion.

In an example, the external portion comprises a wing portion extending from the cavity portion, the at least one connector is disposed on the peripheral portion.

In an example, the at least one connector is a high density connector.

In an example, the apparatus further includes a platform comprising a set of platform pads, each of the IC socket interconnects to electrically couple with a corresponding one of the set of platform pads.

In an example, the external portion of the interposer comprises a neck portion extending from the cavity portion and a peripheral portion extending from the neck portion; and a width of the interposer is defined by a width of the cavity of the IC socket and a length of the interposer includes cutouts defined by mechanical obstacles on the platform.

In an example, the apparatus comprises a validation framework to at least one of monitor, debug, validate, test, and verify operation of the IC package.

In one example, method includes: providing a validation framework comprising an interface socket, an interposer, an IC socket, and a reference platform, wherein a lower surface of a cavity portion of the interposer is disposed adjacent a base of the IC socket, the IC socket is disposed on the reference platform, the interface socket is disposed on an upper surface of the interposer, and at least one validation connector is disposed on an external portion of the interposer; engaging the validation framework with a first IC package comprising a first set of IC validation contacts and a first set of IC functional contacts to electrically couple each of a set of platform pads of the reference platform with a corresponding one of the first set of IC functional contacts via an IC socket interconnect of the IC socket, an interposer functional interconnect of the interposer, and one of a set of interface interconnects of the interface socket and to electrically couple each of the at least one validation connector with at least one of the IC validation contacts via an interposer validation interconnect of the interposer and one of the set of interface interconnects of the interface socket; and performing validation of the first IC package.

In an example, the method further includes: disengaging the validation framework from the first IC package; and engaging the validation framework with a second IC package.

In one example, system includes: an integrated circuit (IC) socket having a cavity to receive an IC package comprising a set of IC functional contacts and a set of IC validation contacts, the cavity defined by a base comprising a set of IC socket interconnects and a frame extending from the base with at least one opening through the frame; an interposer comprising: a cavity portion disposed within the cavity of the IC socket; a first external portion extending from the cavity portion through a first one of the at least one opening; at least one connector disposed on the first external portion; a set of interposer functional interconnects, each directly coupled to a corresponding one of the set of IC interconnects and to electrically couple each of the set of IC functional contacts with the corresponding one of the set of IC socket interconnects; and a set of interposer validation interconnects to electrically couple each of the set of IC validation contacts with one of the at least one connector; and a reference platform comprising a set of platform pads, each of the set of IC socket interconnects to electrically couple with a corresponding one of the set of platform pads.

In an example, the system further includes an interface socket disposed on top of the cavity portion of the interposer to removeably engage the IC package, the interface socket comprising a set of interface interconnects to electrically couple each of the set of IC functional contacts with a corresponding one of the set of interposer functional interconnects and to electrically couple each of the set of IC validation contacts with a corresponding one of the set of interposer validation interconnects.

In an example, the interface socket comprises an elastomer socket.

In an example, the IC package is a CPU IC package.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   an integrated circuit (IC) socket having a cavity to receive an IC package comprising first and second sets of IC contacts, the cavity defined by a base comprising a set of IC socket interconnects and a frame including a plurality of corner portions extending upwards from corners of the base with an opening extending through the frame, between adjacent corner portions of the plurality of corner portions; and
   an interposer comprising:
      a cavity portion disposed adjacent to the base of the IC socket and the plurality of corner portions;
      an external portion extending from the cavity portion through the opening;
      at least one connector disposed on the external portion;
      a first set of interposer interconnects to electrically couple the first set of IC contacts with the set of IC socket interconnects; and
      a second set of interposer interconnects to electrically couple the second set of IC contacts with the at least one connector.

2. The apparatus of claim 1 wherein the first set of interposer interconnects comprises a set of interposer functional interconnects, each to electrically couple with a corresponding IC contact of the first set of IC contacts, the first set of IC contacts comprising a set of IC functional contacts.

3. The apparatus of claim 1, wherein the second set of interposer interconnects comprises a set of interposer validation interconnects, each to electrically couple with a corresponding IC contact of the second set of IC contacts, the second set of IC contacts comprising a set of IC validation contacts.

4. The apparatus of claim 1, wherein the first set of interposer interconnects is arranged in a first pattern to electrically couple with the first set of IC contacts arranged in the first pattern.

5. The apparatus of claim 1, wherein the second set of interposer interconnects is arranged in a second pattern to electrically couple with the second set of IC contacts arranged in the second pattern.

6. The apparatus of claim 1, wherein the second set of interposer interconnects is disposed along a periphery of the cavity portion of the interposer, to electrically couple with the second set of IC contacts disposed along a periphery of the IC package.

7. The apparatus of claim 1, further comprising an interface socket disposed on top of the cavity portion of the interposer to removably engage the IC package, the interface socket comprising a set of interface interconnects to electrically couple the first set of IC contacts with the first set of interposer interconnects and to electrically couple the second set of IC contacts with the second set of interposer interconnects.

8. The apparatus of claim 7, wherein the interface socket comprises a flexible pressure fit socket.

9. The apparatus of claim 1, wherein:
the external portion of the interposer comprises a neck portion extending from the cavity portion and a peripheral portion extending from the neck portion;
the at least one connector is disposed on the peripheral portion;
the neck portion has a width corresponding to a distance between the adjacent corner portions of the frame; and
a width of the peripheral portion is greater than a width of the neck portion.

10. The apparatus of claim 1, wherein:
the external portion comprises a wing portion extending from the cavity portion through the opening;
the wing portion has a width corresponding to a distance between the adjacent corner portions; and
the at least one connector is disposed on the wing portion.

11. The apparatus of claim 10, wherein the at least one connector is a high-density connector.

12. The apparatus of claim 1, further comprising a platform comprising a set of platform pads, wherein each of the IC socket interconnects is to electrically couple with a corresponding platform pad of the set of platform pads.

13. The apparatus of claim 1, wherein:
the IC socket interconnects are coupled to a platform below the base of the cavity of the IC socket;
the external portion of the interposer comprises a neck portion extending from the cavity portion through the opening and a peripheral portion extending from the neck portion;
a width of the peripheral portion is greater than a width of the neck portion; and
a cutout region in the interposer is provided by the neck portion and the peripheral portion to avoid one or more mechanical obstacles on the platform.

14. The apparatus of claim 1, wherein the apparatus comprises a validation framework to at least one of monitor, debug, validate, test, or verify operation of the IC package.

15. The apparatus of claim 1, wherein:
the external portion is a first external portion;
the opening is a first opening;
a second opening extends through the frame, between adjacent corner portions of the plurality of corner portions; and
the interposer comprises a second external portion extending from the cavity portion through the second opening in a direction opposite to a direction of the first external portion, and at least one connector disposed on the another external portion.

16. A method comprising:
providing a validation framework comprising an interface socket, an interposer, an integrated circuit (IC) socket, and a reference platform, wherein a lower surface of a cavity portion of the interposer is disposed adjacent to a base of the IC socket, the IC socket is disposed on the reference platform, the interface socket is disposed on an upper surface of the interposer, and at least one validation connector is disposed on an external portion of the interposer, the cavity portion is within the IC socket, and the external portion extends laterally from the cavity portion, outside the IC socket;
engaging the validation framework with a first IC package comprising a first set of IC validation contacts and a first set of IC functional contacts to;
electrically couple each of a set of platform pads of the reference platform with a corresponding IC functional contact of the first set of IC functional contacts via an IC socket interconnect of the IC socket, an interposer functional interconnect of the interposer, and an interface interconnect of a set of interface interconnects of the interface socket; and
electrically couple the at least one validation connector with at least one of the IC validation contacts via an interposer validation interconnect of the interposer and an interface interconnect of the set of interface interconnects of the interface socket; and
performing validation of the first IC package.

17. The method of claim 16, wherein the method further comprises:
disengaging the validation framework from the first IC package; and
engaging the validation framework with a second IC package.

18. A system comprising:
an integrated circuit (IC) socket having a cavity to receive an IC package comprising a set of IC functional contacts and a set of IC validation contacts, the cavity defined by a base comprising a set of IC socket interconnects and a frame including a plurality of corner portions extending upwards from corners of the base with at least one opening through the frame, between adjacent corner portions of the plurality of corner portions;
an interposer comprising:
a cavity portion disposed within the cavity of the IC socket;
an external portion extending from the cavity portion through an opening of the at least one opening between the adjacent corner portions;
at least one connector disposed on the external portion;
a set of interposer functional interconnects, each directly coupled to a corresponding one of the set of IC interconnects and to electrically couple the set of IC functional contacts with the corresponding one of the set of IC socket interconnects; and
a set of interposer validation interconnects to electrically couple each of the set of IC validation contacts with the at least one connector; and
a reference platform comprising a set of platform pads, each of the set of IC socket interconnects to electrically couple with a corresponding one of the set of platform pads.

19. The system of claim 18, further comprising an interface socket disposed on top of the cavity portion of the interposer to removably engage the IC package, the interface socket comprising a set of interface interconnects to electrically couple each of the set of IC functional contacts with a corresponding one of the set of interposer functional interconnects and to electrically couple each of the set of IC validation contacts with a corresponding one of the set of interposer validation interconnects.

20. The system of claim 19, wherein the interface socket comprises an elastomer socket.

* * * * *